(12) United States Patent
Chen et al.

(10) Patent No.: US 8,569,808 B1
(45) Date of Patent: Oct. 29, 2013

(54) TEMPERATURE STABILITIZED MEMS

(75) Inventors: Tung-Tsun Chen, Hsinchu (TW);
Chia-Hua Chu, Zhubei (TW);
Chung-Hsien Lin, Hsinchu (TW);
Jui-Cheng Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/441,134

(22) Filed: Apr. 6, 2012

(51) Int. Cl.
*H01L 29/66* (2006.01)

(52) U.S. Cl.
USPC .......... 257/252; 257/E31.131; 257/467; 331/70

(58) Field of Classification Search
USPC ......... 257/252, 527, 258, 415, 414, 416, 684, 257/467, E31.131; 438/48; 310/12
See application file for complete search history.

(56) References Cited

U.S. PATENT DOCUMENTS

| | | | |
|---|---|---|---|
| 5,783,854 A | 7/1998 | Dries et al. | |
| 6,627,859 B1* | 9/2003 | Kasai et al. | 219/505 |
| 7,126,741 B2* | 10/2006 | Wagner et al. | 359/290 |
| 7,704,847 B2 | 4/2010 | Cannon et al. | |
| 8,105,960 B2* | 1/2012 | Doris et al. | 438/780 |
| 2010/0079533 A1 | 4/2010 | Gulvin et al. | |
| 2011/0221074 A1* | 9/2011 | Kang et al. | 257/778 |
| 2011/0222033 A1* | 9/2011 | Ten Kate et al. | 355/30 |
| 2011/0273186 A1 | 11/2011 | Karnad et al. | |
| 2012/0032346 A1* | 2/2012 | Najafi et al. | 257/774 |
| 2012/0085748 A1* | 4/2012 | Le Neel et al. | 219/494 |
| 2012/0161259 A1* | 6/2012 | Loeppert et al. | 257/416 |
| 2012/0250925 A1* | 10/2012 | Lillelund | 381/355 |
| 2012/0268216 A1* | 10/2012 | Borremans | 331/70 |

OTHER PUBLICATIONS

Hwang, W.J. et al., "Development of Micro-Heaters with Optimized Temperature Compensation Design for Gas Sensors", Sensors 2011, Mar. 1, 2011, 11:2580-2591, ISSN 1424-8220.
Fuller, L., "Resistors: Heaters and Temperature Sensors", Rochester Institute of Technology Microelectronic Engineering, Dec. 5, 2011, 43 pages.
Cahoon, C.W., Thesis Paper entitled "Low-Voltage CMOS Temperature Sensor Design Using Shottky Diode-Based References", Jun. 2008, Boise State University, 118 pages.
Johari, H., Thesis Paper "Development of MEMS Sensors for Measurements of Pressure, Relative Humidity, and Temperature", submitted to Worcester Polytechnic Institute, Apr. 29, 2003, 213 pages.

* cited by examiner

*Primary Examiner* — Jarrett Stark
*Assistant Examiner* — Shahed Ahmed
(74) *Attorney, Agent, or Firm* — Duane Morris LLP

(57) ABSTRACT

A semiconductor device with temperature control system. Embodiments of the device may include a MEMS chip including a first heater with a dedicated first temperature control loop and a CMOS chip including a second heater with a dedicated second temperature control loop. Each control loop may have a dedicated temperature sensor for controlling the thermal output of each heater. The first heater and sensor are disposed proximate to a MEMS device in the MEMS chip for direct heating thereof. The temperature of the MEMS chip and CMOS chip are independently controllable of each other via the temperature control loops.

13 Claims, 14 Drawing Sheets

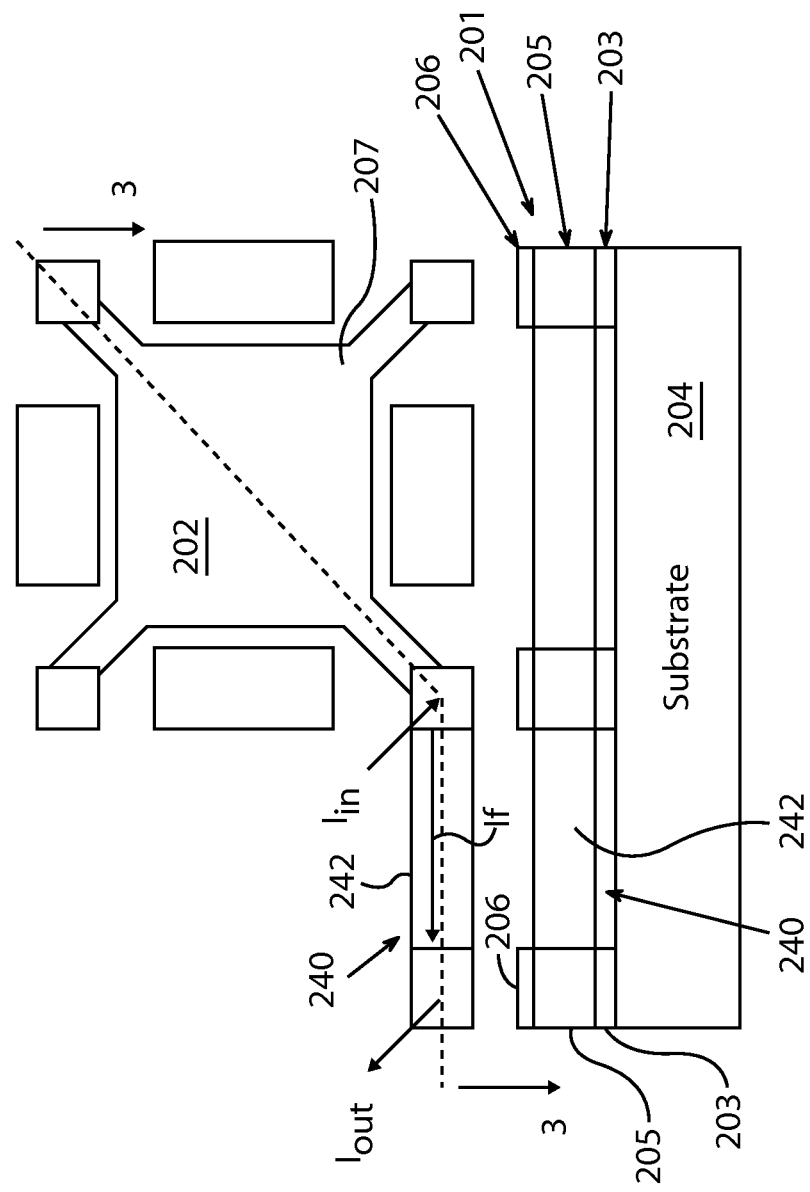

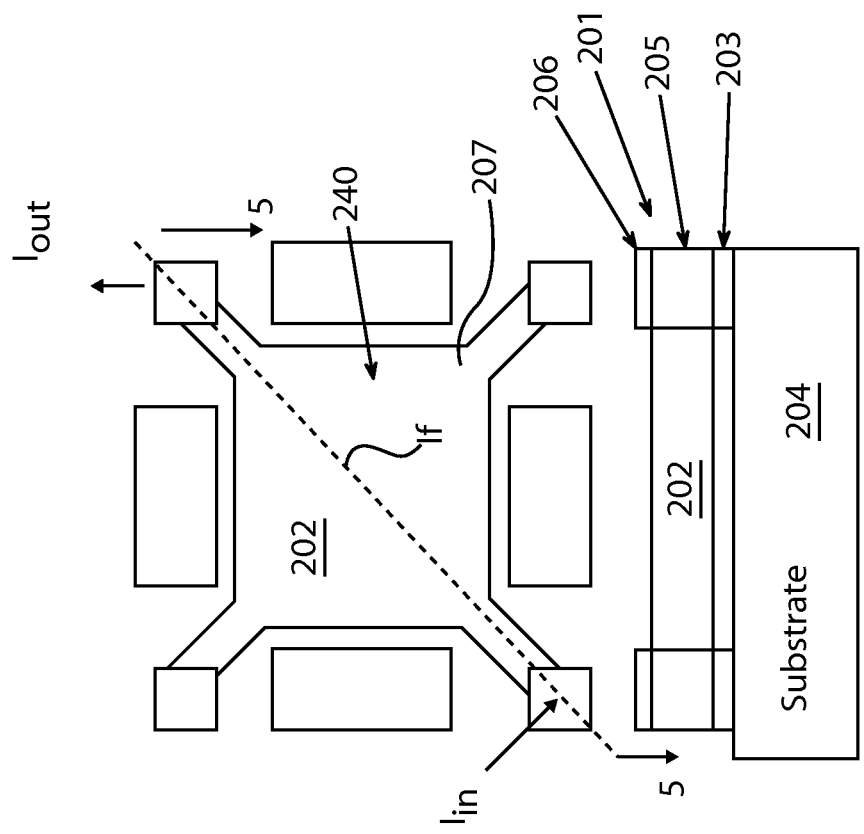

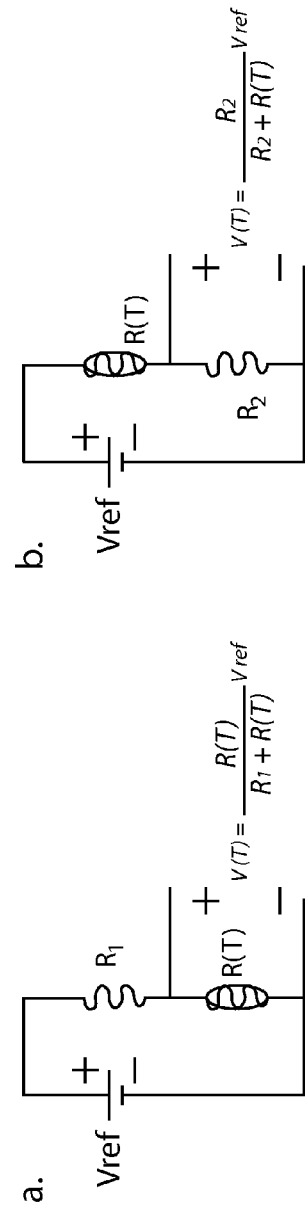
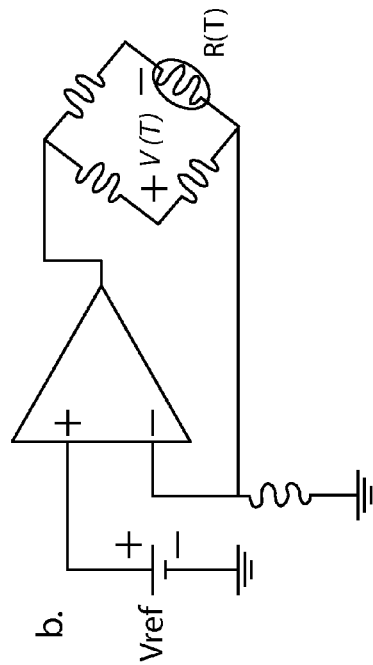
Voltage Divider
FIG. 16
Wheatstone bridge
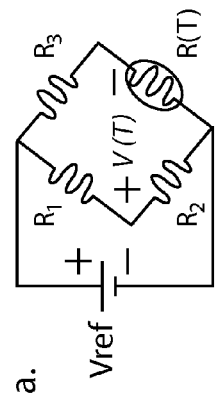
FIG. 17

TEMPERATURE STABILIZED MEMS

FIELD

The present invention generally relates to semiconductors structures, and more particularly to semiconductor structures including micro-electro-mechanical systems (MEMS) and methods for forming the same.

BACKGROUND

Semiconductor device packages are comprised of different types of active devices incorporated within the package that serve various functions. Semiconductor packages include CMOS (complementary metal oxide semiconductor) devices such as chips built on a silicon substrate or wafer. In some instances, the CMOS chip may be an application-specific integrated circuit (ASIC) chip which is generally classified as a chip having an integrated circuit (IC) that is custom built for a specific end use or purpose. Some ASIC chips may be a system-on-chip (SoC) which includes a processor, memory devices, and other ancillary components that are built on an application specific chip.

MEMS devices of various types are sometime incorporated into the semiconductor package to augment and support the functionality of the ASIC chips in the package. MEMS devices are micro-sized devices or machines that may have stationary and/or movable elements that provide some type of electro-mechanical functionality desired for a particular application and system. Some type MEMS devices which may be found in a semiconductor chip package may include, for example without limitation, micro-timing devices (i.e. resonators, oscillators, real-time clocks, clock generators, etc.), micro-sensors (e.g. pressure and temperature transducers that convert mechanical movement or displacement into electrical signals), micro-actuators, accelerometers, micro-switches, micro-pumps and valves, and others that support and assist with controlling the functionality of the chip(s) in the package and/or system-level integrated circuit (IC).

MEMS devices have dimensions that may fall in a range from less than 1 micron to several millimeters in size. MEMS devices may be constructed on a silicon substrate or wafer similarly to CMOS chips by using various fabrication techniques including without limitation bulk micromachining of the silicon substrate itself and/or surface micromachining involving building microstructures on the surface of the substrate using various semiconductor IC fabrication technologies such as material deposition, patterned photolithography, and etching. The foregoing manufacturing techniques may be used to construct many different types of MEMS devices from simple structures with no moving elements to complex electromechanical systems having a plurality of moving elements that may be controlled by integrated microelectronics. The MEMS chip is mounted in the semiconductor package at the wafer level with the ASIC chip.

MEMS devices and their performance are sensitive to operating temperature and temperature fluctuations which may be caused by swings in ambient temperatures and cause differential thermal expansion problems of the elements used to construct the MEMS device since different types of materials used may each have different coefficients of thermal expansion. Thermal excursions due to ambient temperature excursions may also cause temperature induced voltage drift and other similar electrical problems adversely affecting the performance of the MEMS. Accordingly, it is desirable to regulate and control the operating temperature of the MEMS device independent of the ambient operating environment temperature in which the device may be located. Optimally, it is beneficial that the operating temperature of the MEMS device remain relatively uniform or stable during its operation irrespective of changing ambient conditions or operating environments to avoid operating temperature swings and potential performance problems.

An improved temperature control system for MEMS devices is desired.

BRIEF DESCRIPTION OF THE DRAWINGS

The features of the preferred embodiments will be described with reference to the following drawings where like elements are labeled similarly, and in which:

FIGS. 2 and 3 are a schematic diagram top view and cross-sectional side/elevation view respectively of one possible embodiment of a MEMS heater;

FIGS. 4 and 5 are a schematic diagram top view and cross-sectional side/elevation view respectively of a second possible embodiment of a MEMS heater;

FIGS. 16-18 are schematic diagrams of exemplary embodiments of temperature sensors.

Figure 1:
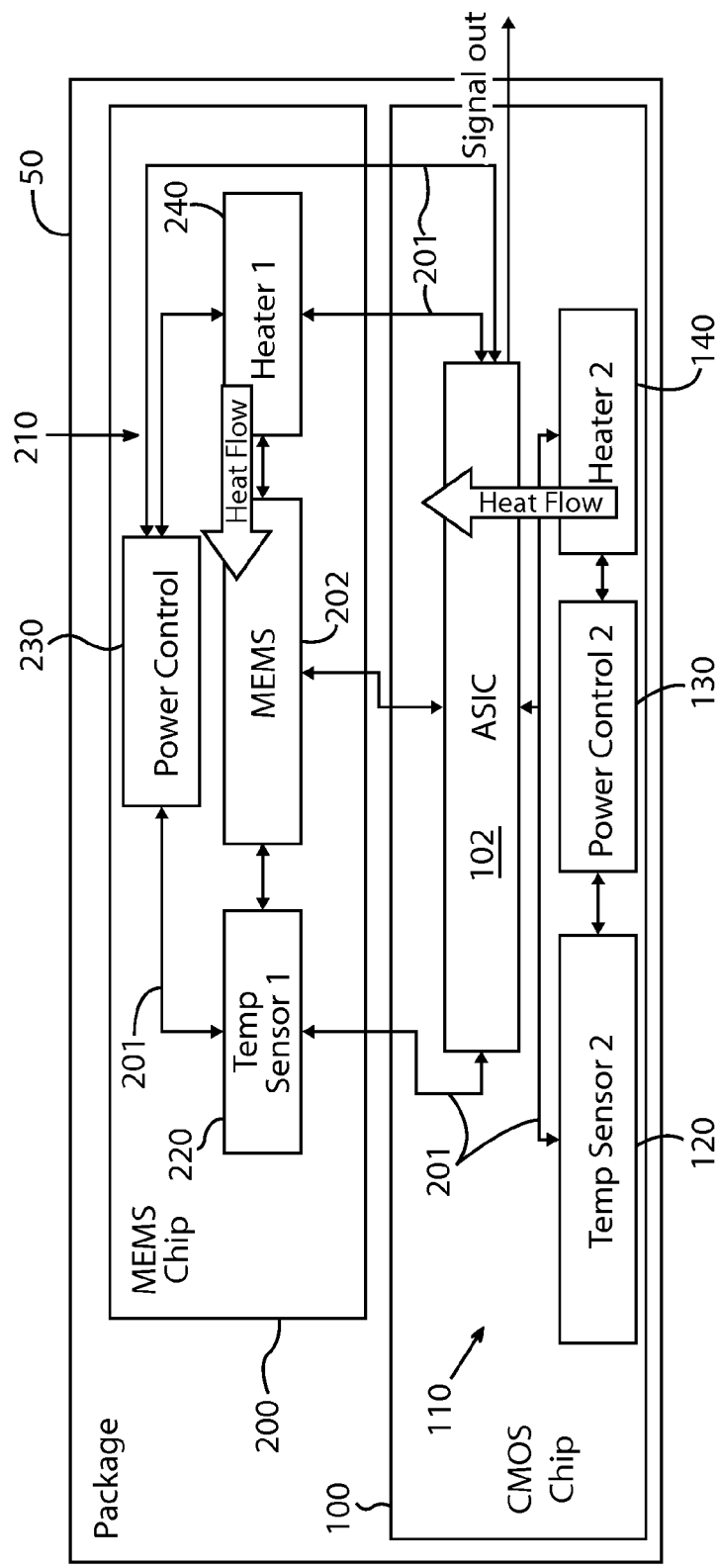
FIG. 1 is a schematic system block diagram showing one embodiment of temperature control system for regulating the temperature of devices in a semiconductor package.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto. The term signal as used herein means any voltage, current, charge, data, or other signal.

One approach to controlling and regulating MEMS temperatures is to heat the entire semiconductor package that houses the MEMS device and CMOS chip which may include an ASIC using a single heater that is integrated into the package for heating both the MEMS device and CMOS chip. It is desirable to control and maintain a uniform temperature for the CMOS chip for the same reasons as maintaining a steady MEMS temperature as already described herein to protect chip performance by minimizing differential thermal expansion and operating temperature swings. In this semiconductor package-level heating approach, the MEMS device and chip are heated together using a single heater and temperature sensor disposed somewhere in the package (sometimes nearest the chip). This may make it difficult to control the temperature of and efficiently heat both the MEMS device and chip uniformly due to the temperature sensor and heater being remote from the MEMS device. In addition, heating the entire package and cavity formed inside the package increases power consumption and correspondingly lower heating efficiency. The accuracy of the temperature sensor and capability of the chip to accurately control the temperature of the MEMS device to eliminate operating temperature swings may further be problematic in this embodiment.

FIG. 1 is a schematic system block diagram showing one embodiment of temperature control system for regulating the temperature of devices in a semiconductor package. The semiconductor package 50 may include a CMOS chip 100 and a MEMS chip 200 as shown. In some embodiments, the chip 100 may be may be an ASIC chip including an ASIC 102. MEMS chip 200 includes a MEMS element or device 202. CMOS chip 100 and MEMS chip 200 are mounted and bonded in semiconductor package 50 which may be sealed from the environment. In some embodiments, semiconductor package may be a chip-scale-package (CSP). Semiconductor package 50 may be made of a plastic, ceramic, or other suitable materials.

The temperature control system of FIG. 1 includes a separate and dedicated heater and temperature sensor for both the chip 100 and MEMS device 202 to accurately regulate both the chip and MEMS device operating temperatures. Accordingly, in this embodiment, the MEMS heater is packaged with the MEMS chip 200 instead of utilizing the single heater packaged with the CMOS chip as in the prior example above. The temperatures of the chip 100 and MEMS device in semiconductor package 50 may therefore advantageously be independently controlled and adjusted in the embodiment shown.

Referring to FIG. 1, the semiconductor package 50 includes a chip temperature control subsystem or loop 110 and a MEMS temperature control subsystem or loop 210. The chip temperature control loop 110 includes temperature sensor 120, power controller 130, and heater 140, all of which may be mounted on or in the CMOS chip 100. Similarly, MEMS temperature control loop 210 in one embodiment includes a separate or discrete temperature sensor 220, power controller 230, and heater 240, all of which may be mounted on or in the MEMS chip 200 so as to be in close proximity to the MEMS device 202 for improving heating performance.

The foregoing temperature control loop components, MEMS device 202, and ASIC 102 are electrically coupled together by conductive interconnects 201 as represented by the double-head arrows shown in FIG. 1. The interconnects 201 may be in the form of conductive traces, lines, pad, wires, vias, or other electrically conductive structures used for interconnects in semiconductor and MEMS fabrication. The interconnects 201 form a two way electrical and signal communication pathways between the components in FIG. 1 as shown. In some embodiments, the interconnects may be made of a material or combination/alloys of materials including without limitation metals (e.g. copper, aluminum, gold, titanium, tungsten, platinum, etc.), polysilicon, or other electrically conductive materials.

Referring to FIG. 1, temperature sensor 120 operably measures actual operating temperatures of temperature sensitive ASIC 102 in CMOS chip 100 and generates temperature signals representing the measured temperature to ASIC 102. Similarly, temperature sensor 220 operably measures actual operating temperatures of temperature sensitive MEMS device 202 in MEMS chip 200 and generates temperature signals representing the measured temperature to ASIC 102. ASIC 102 is operative to control the heating and temperature of CMOS chip 100 and MEMS chip 200. In some embodiments, ASIC 102 may generate an output data signals as shown containing information representing temperatures measured for CMOS chip 100 and MEMS chip 200, as well as other operating parameters for the temperature control loops.

Temperature sensors 120, 220 may be any type of temperature measurement device suitable for incorporation into a semiconductor package 50. In some embodiments, temperature sensors 120 and 220 may be a semiconductor or IC temperature sensor which is an electronic device fabricated in a similar way to other semiconductor components using semiconductor and MEMS fabrication processes. Such devices may include, without limitation, voltage output, current output, resistance output, digital output, and diode type semiconductor temperature sensors built upon a silicon substrate or wafer and embedded in the chip as will be well known in the art. The digital temperature sensor integrates a sensor and an analog to digital converter (ADC) on a silicon chip and may be configured for thermal management of microprocessor chips. In some embodiments, resistor output silicon-based temperature sensors may include varying constructions including diffused resistors, ion implanted resistors, and thin film resistors having resistive elements made of a thin film layer of polysilicon, metal or metal alloys, or other suitable electrically conductive materials having a bulk resistance.

The foregoing resistor-type silicon-based temperature sensors are used to measure temperature by correlating the bulk resistance or resistivity of the resistive element used in the sensor with temperature. The temperature is proportional to and varies with the resistance. The resistive element has predictable variations in resistance at different temperatures such that a measured change in resistance (R) as electrical current (I) and voltage (V) is applied can be correlated to and may be used to determine temperature such as by using Ohms Law (I=V/R). The operation and use of such resistors to measure and determine temperature by converting resistance (based on measured current or voltage from the resistive element) into a representative temperature is well known to those skilled in the art without further elaboration.

In some embodiments, temperature sensor 120, 220 is a semiconductor thermal diode temperature sensor having a silicon diode and utilizing proportional to absolute temperature (PTAT) temperature sensing which outputs a signal proportional to absolute temperature. The absolute temperature can be calculated from the equation: $T=(V1-V2)/(8.7248 \times 10-5 \ln(I1/I2))$. Such temperature sensors and determination of temperature are well known to those skilled in the art without further elaboration.

Referring to FIG. 1, heaters 140, 240 may be any type of heater suitable for incorporation into a semiconductor package 50. Heater 140, 240 may be a semiconductor heater having a heating element which generates heat when an electric current flows through the element. In one possible embodiments, the heating element may be a resistive-type heating element built on or in a silicon-based wafer substrate and containing a resistive heating layer or element 142, 242 of any suitable configuration which generates heat by resistance when a voltage and current is applied across the resistive element. In some embodiments, such semiconductor resistance heaters may be structured similarly to the resistor output silicon-based temperature sensors 120, 220 (e.g. diffused resistors, ion implanted resistors, and thin film resistors temperature sensors) already described herein having the resistive element embedded in the silicon substrate, suspended above and spaced apart from the substrate, or isolated by at least one dielectric layer from the substrate. The resistive elements formed in a semiconductor sensor or heater function in the similar manner, and therefore may be used for both temperature sensing and heating applications. Semiconductor resistance type heaters are well known in the art.

The resistive heating elements 142, 242 in heaters 140, 240 may be formed of any suitable conductive material having bulk resistance and which will generate heat when a voltage and current is applied across the element. In some embodiments, without limitation, the resistive heating elements may be made of polysilicon, metals and/or meal alloys, minimally conductive oxide resistive materials, metal nitride, metal silicide materials, and others. Resistive heating elements 142, 242 may have any suitable configuration and cross-sectional shape as desired for the intended application. The resistive heating elements typically have a generally square or rectangular cross-sectional shape (to current flow), and in some embodiments the vertical thickness of the resistive layer or elements may be relatively thin in comparison with the width of the elements particularly if a thinly deposited but wide layer of the resistive material is used. Since the resistance varies with the cross-sectional area to current flow through the resistor, for a fixed resistance desired for generating a given amount of heating when current and voltage is applied, the width of the resistive element gets larger as the thickness gets thinner, and vice-versa.

FIGS. 2-3, 4-5, and 6-7 are schematic diagram top views and cross-sectional views respectively of three possible embodiments and arrangements of MEMS heater 240. Heater 240 may be located proximate to and in conductive direct contact with body 207 of MEMS device 202 as shown. Heater 240 is in conductive thermal communication with the MEMS device 202, and the heater is operative to generate and transfer heat directly to the body of the MEMS device by conductive contact with the body 207 thereby minimizing heat loss to the semiconductor package 50 or other components such as CMOS chip 100 located in the package.

FIGS. 2 and 3 shows one embodiment of heater 240 which may be built adjacent to but proximate MEMS device 202 and anchored on the same substrate 204 as the MEMS device. The heater 240 in this embodiment is proximate to and conductively coupled directly to the MEMS device 202 via physical contact as shown to transfer heat by means of conduction to the body 207 of MEMS device 202. This direct coupling/contact and proximity of the heater 240 advantageously and efficiently heats the MEMS device 202. The current input "Iin" and current output "Iout," as well as the current flow "If" through resistive heating element 242 are shown. Current input In and output Iout may be reversed or arranged in any other suitable manner.

Both the body 207 of MEMS device 202 and resistive element 242 may be thermally and electrically isolated from and suspended above substrate by isolation pedestals 201 as shown in FIGS. 2-7, which in some embodiments may include insulating spacers 203, conductive blocks 205, and bond pads 206. In some embodiments, insulating spacers 203 may be made of an electrically and thermally insulating layer of silicon dioxide (SiO2) or similar insulating material. The spacers 203 may also serve to anchor the MEMS device 202 and/or resistive heating element 242 to the substrate 204. Electrically and thermally conductive blocks 205 may be formed on the isolation spacers 203 as shown in FIGS. 2 and 3 by any suitable manner used in the semiconductor art. In some embodiments, conductive blocks 205 may be made of polysilicon, silicon, silicon germanium (SiGe), metal, or other suitable electrically conductive materials. Conductive blocks 205 are operable to receive and transmit electrical current, and to further receive and transmit heat generated by resistive heating element 202 to body 207 of MEMS device 202. In some embodiments, the conductive blocks 205 may be capped by bond pads 206 formed of a suitable metal conductor for electrical bonding and interconnection to the CMOS chip 100 or other device or component used in the semiconductor package 50. The bond pads 206 on either end of resistive element 242 are coupled to the power supply to the element which is controlled by power controller 230.

The substrate 204 may be of any suitable type and material used in the semiconductor art including without limitation silicon, SOI (silicon-on-insulator), SGOI (silicon germanium-on-insulator), or other thermal isolation substrates in some possible embodiments.

FIGS. 4 and 5 show another possible embodiment of heater 240 in which the body 207 of MEMS device 202 itself is used as the resistive heating element. In one embodiment, the MEMS body 207 may be made of polysilicon which will conduct electrical current and generate heat. The current may be applied via the bond pad 206 as shown. The isolation spacers 203 and conductive blocks 205 structures may be arranged similarly to that shown in FIGS. 2 and 3.

Figure 6:
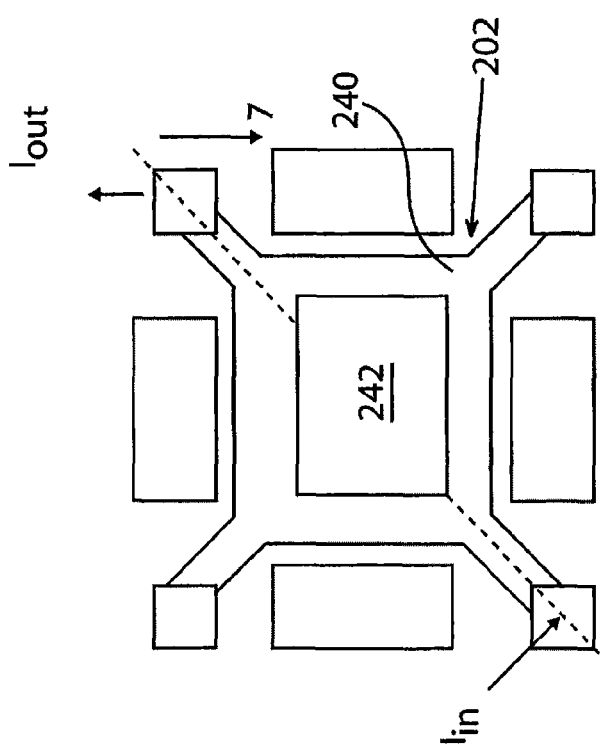
FIGS. 6 and 7 are a schematic diagram top view and cross-sectional side/elevation view respectively of a third possible embodiment of a MEMS heater.
Figure 7:
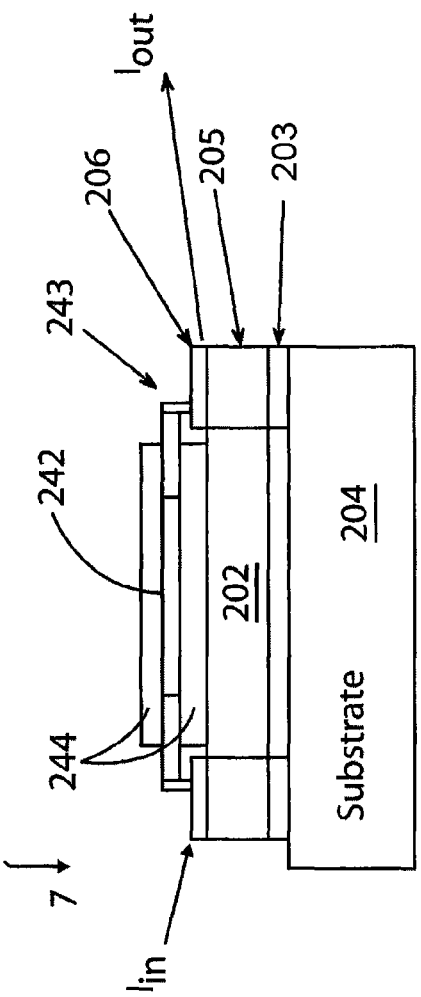

FIGS. 6 and 7 show another possible embodiment of heater 240 which is a semiconductor "on-chip" heater which is embedded within or built on the body 207 of MEMS device 202. Such thin film heaters are well known in the art. The resistive heating element 242 is in the form of a layer formed above, on, or embedded in body 207 but in thermal conductive communication therewith. In some embodiments, resistive element 242 may be formed on a first dielectric layer 244 and surrounded by a second dielectric 244 or other passivation layer as shown. Heat generated by resistive heater element 242 is conducted through dielectric layer 244 below to heat the body 207 of MEMS device 202. Conductive leads 243 may be provided to electrically connect the bond pads 206 to resistive heating element 242 as shown. The current may be applied via the bond pad 206 as shown to the resistive element. The isolation spacers 203 and conductive blocks 205 structures may be arranged similarly to that shown in FIGS. 2 and 3.

It should be recognized that although the embodiment shown in FIGS. 6-7 places the resistive heating element 242 above MEMS body 207, the heating element may also be built beneath but in thermal communication with the body. On-chip semiconductor resistor heaters and their construction are well known in the art; the heater shown in FIGS. 6-7 representing only one possible arrangement.

Heater 140 may be configured similarly to heater 240 as in any of the foregoing embodiments in FIGS. 2-7.

With continuing reference to FIG. 1, power controllers 130 and 230 each include circuitry that is operative to regulate the current or voltage to heaters 140 and 240 thereby controlling the amount of heat generated by the heaters. Power controllers 130, 230 are connected to a power supply 70 (see FIG. 10), which in some embodiments may be a DC power supply of suitable voltage generated by any suitable source.

In any of the above described possible embodiments of MEMS heater 240 shown in FIGS. 2-7, either a constant voltage or constant current scheme may be used to generate heat. This is also applicable to CMOS heater 140. In the constant voltage scheme, heat is generated by $P=V^2/R$ (where P=power, V=voltage, R=resistance). In the constant current scheme, heat is generated by $P=I^2R$. The same applied to CMOS heater 140. The power P dissipated by resistive element 202 is equated with the heat generated by heater 240 which is available for heating MEMS device 202. Depending on the scheme selected, the power controllers 130, 230 will be configured to vary either the current (for constant voltage scheme) or the voltage (for constant current scheme) for controlling the power input to heaters 140, 240 and corresponding heat output from the heaters for heating CMOS chip 100 and MEMS chip 200. It is well within the knowledge of those skilled in the art to design such circuits for power controllers 130, 230.

Figure 14:
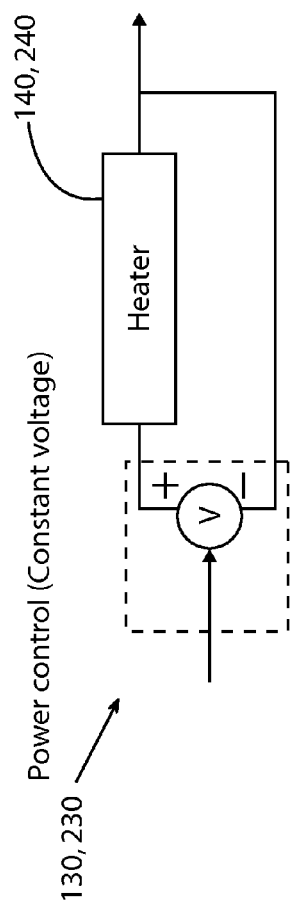
FIG. 14 is a schematic diagram of a constant voltage power control scheme.
Figure 15:
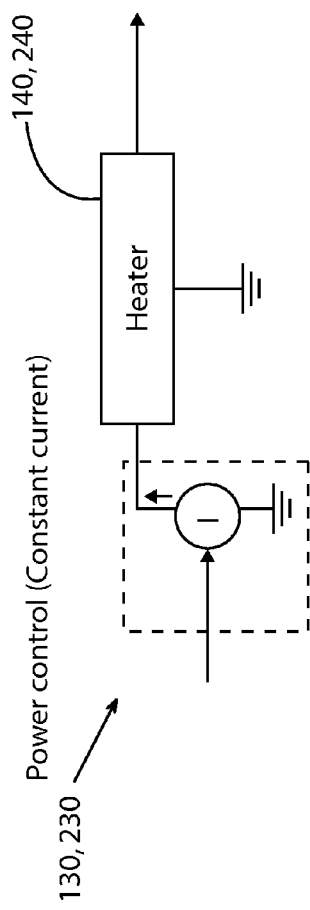
FIG. 15 is a schematic diagram of a constant current power control scheme.

FIGS. 14 and 15 are exemplary schematic diagrams representing a constant voltage and constant current power control scheme for power controllers 130, 230, respectively.

With continuing reference to FIG. 1, ASIC 102 may include temperature control circuitry configured to control operation of heaters 140, 240 via temperature control loops 110 and 210 respectively. In operation, ASIC 102 receives electrical signals from temperature sensor 220 (e.g. current or voltage) which are indicative of the temperatures measured for MEMS device 202. ASIC 102 processes the signals and converts the signals into a measured temperature based on the known resistance of the resistive elements in the temperature sensors. The actual or measured temperature (e.g. Tm) is compared to a desired predetermined setpoint temperature (e.g. Tset) preprogrammed or input into ASIC 102. If Tm is above or below the desired setpoint temperature Tset either absolutely or within a predefined tolerance range, ASIC 102 adjusts (i.e. increases or decreases) the power supply to the heater 240 via circuitry in power controller 230 to adjust the temperature of MEMS device 202 as required to bring the temperature Tm back within range. Since the heater 240 and temperature sensor 220 are located proximate to or on MEMS device 202, the response to a temperature change is rapid and lag time to bring the temperature of the MEMS device back into compliance is minimized. ASIC 102 may control its own temperature in a similar manner using temperature sensor 120, power controller 130, and heater 140.

In some embodiments, the MEMS temperature control loop 210 may be configured to maintain the temperature of MEMS chip 200 at or higher than the ambient operating environment in which semiconductor package 50 may be located. For example, without limitation, if the ambient operating environment temperature is approximately 40 degrees C., ASIC 102 may be configured with a higher setpoint temperature Tset of about 75 degrees C. at which the MEMS chip 200 is desired to be maintained. Accordingly, no cooling is needed for the MEMS device. In some situations, it is useful to maintain the setpoint temperature Tset higher enough to account for anticipated variations in ambient temperature so that the actual measured temperature Tm of MEMS chip 200 is maintained above the highest anticipated ambient temperature swing. It is helpful to maintain a constant MEMS chip temperature to maintain a stable MEMS temperature and preserve performance of the MEMS device 202 regardless of the fact that the setpoint temperature Tset is set higher than the ambient conditions. Certain design considerations and limitations will apply such as such as minimizing the power consumed by the MEMS heater 240 by not setting the setpoint temperature Tset too high.

Figure 8:
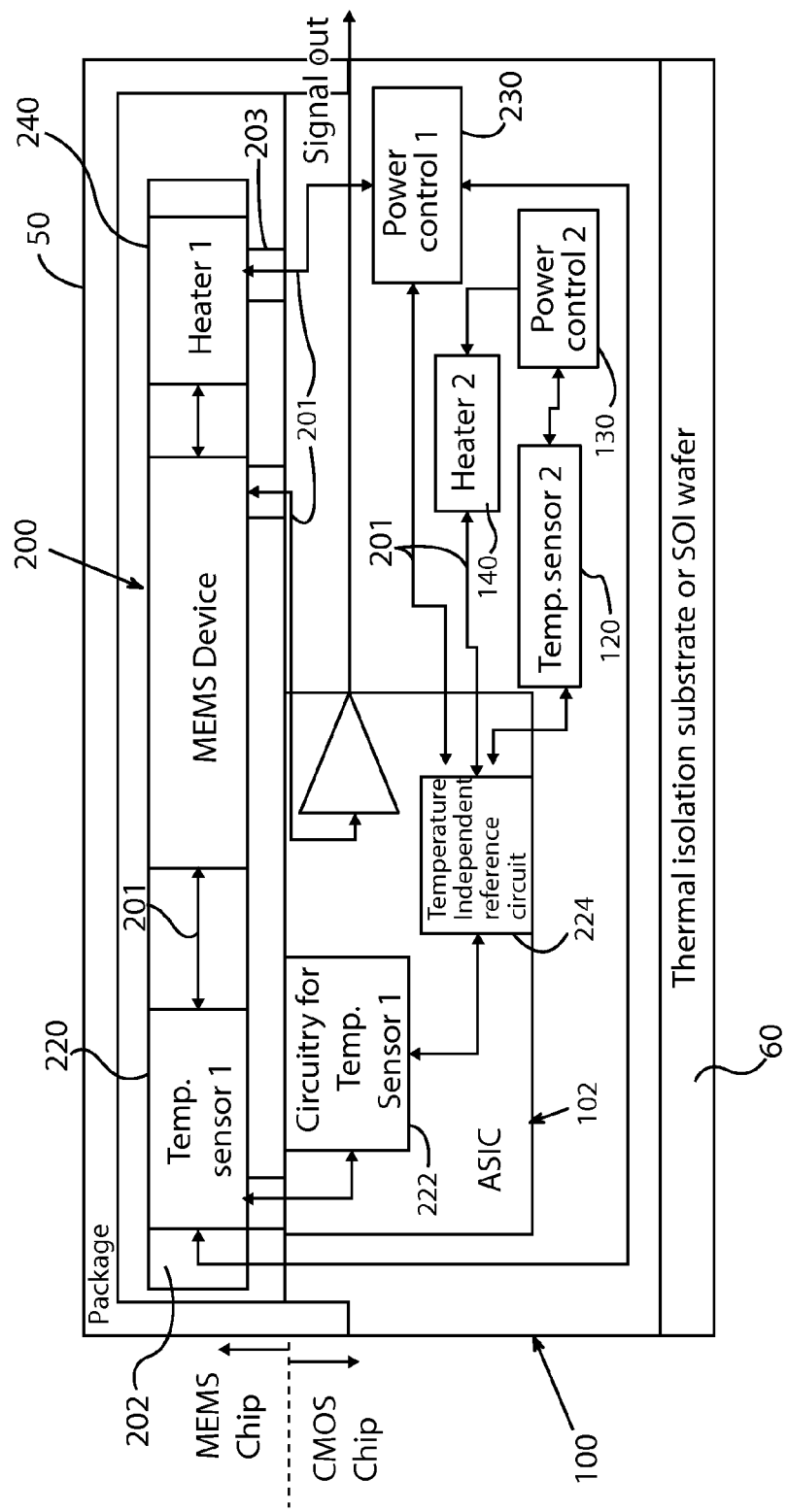
FIG. 8 is a schematic diagram showing one possible embodiment and arrangement of a combination MEMS-CMOS device semiconductor package.
Figure 9:
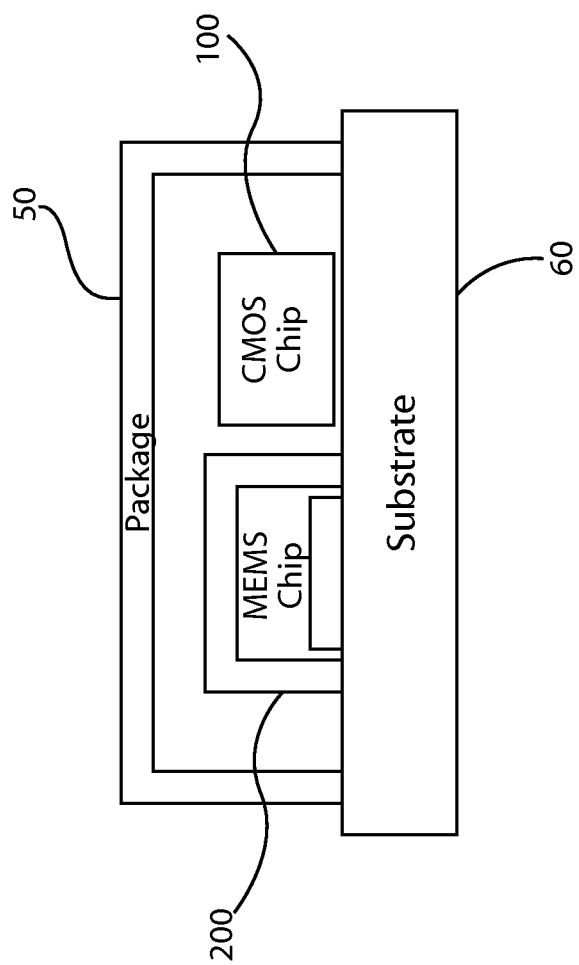
FIG. 9 is a schematic diagram showing another possible embodiment and arrangement of a combination MEMS-CMOS device semiconductor package.

FIGS. 8 and 9 show two possible schematic arrangements and embodiments of a combination MEMS-CMOS semiconductor package 50. FIG. 9 is a side/elevation cross-sectional view through the semiconductor package and shows an arrangement in which the MEMS chip 200 is stacked above and supported by the CMOS chip 100 below. This arrangement minimizes the amount of wafer or substrate spaced consumed by the semiconductor package and is consistent with 2.5 D/3 D IC chip stacking methodology.

Referring to FIG. 8, the MEMS chip 200 may house temperature sensor 220 and heater 240 in addition to MEMS device 202. The power controller 230 for MEMS heater 240 may be contained in CMOS chip 100, which in some embodiments may also contain temperature sensing circuitry 222 for temperature sensor 220 and a temperature independent reference circuit 224 for regulating the temperature of MEMS device 202 as further described herein. This arrangement beneficially minimizes the size of the MEMS chip. In one embodiment, as shown, temperature sensing circuitry 222 for temperature sensor 220 and a temperature independent reference circuit 224 may be located in ASIC 102. The MEMS chip 200 may be structured and configured similarly to any of the embodiments shown in FIGS. 2-7. Insulating isolation spacers 203 may therefore be provided to space and support MEMS chip 200 on CMOS chip 100. The CMOS chip 100 is built on and bonded to a suitable wafer substrate 60, which in some embodiments may be silicon, SOI (silicon-on-insulator), SGOI (silicon germanium-on-insulator), or other thermal isolation substrates in some possible embodiments. It should be noted that MEMS chip 200 including heater 240 are represented schematically, and not physically in FIG. 8. Therefore, this figure should not be construed as a physical representation of the MEMS chip.

FIG. 9 is a side/elevation cross-sectional view through the semiconductor package and shows an arrangement in which the MEMS chip 200 and CMOS chip 100 are bonded separately to substrate 60. In both FIGS. 8 and 9, the MEMS chip 200 may be isolated in a confined environment in the chip package 50 as shown, and may be sealed in a vacuum environment. In addition, the MEMS chip 200 may be thermally isolated from the substrate 60 as shown. The sealed and thermally isolated environment advantageously minimizes convective and conductive heat loss from MEMS chip 200 thereby improving temperature control and reducing power requirements for MEMS heater 240. This further enhances the creation of a stable MEMS temperature which translates into improved performance characteristics.

Figure 10:
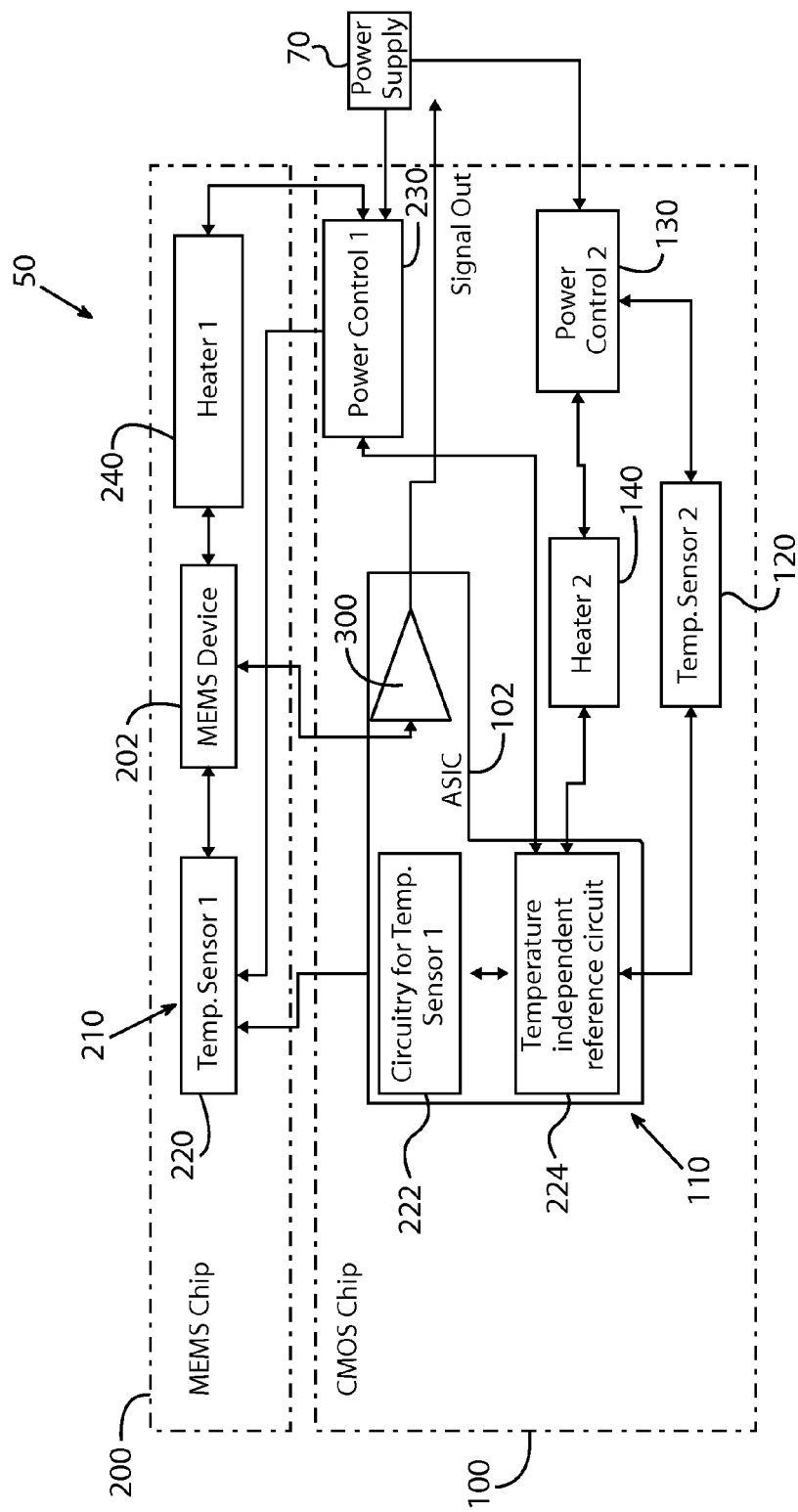
FIG. 10 is a schematic block diagram of a semiconductor package temperature control system applicable to FIGS. 8 and 9.

FIG. 10 is a schematic diagram of the semiconductor package temperature control system applicable to both embodiments of FIGS. 8 and 9. In this embodiment, temperature sensing circuitry 222 for temperature sensor 220 and a temperature independent reference circuit 224 are contained in the CMOS chip 100. FIG. 11C shows temperature sensing circuitry 222 for temperature sensor 220 in greater detail. Temperature sensing circuitry 222 links signal outputs from the temperature independent reference circuit 224 and temperature sensor 220 together to control operation of heater 240 via power control circuitry 230. The temperature sensing circuitry 222 is used to sense and amplify the signal of MEMS chip 200 temperature sensor 220, and includes an amplifier 300 and loop filter 302. The CMOS chip 100 temperature sensor 120 shown in FIG. 11B already contains the circuitry of an amplifier 300 and loop filter 302 to sense and amplify the signal. The temperature independent reference circuit 224 provides a constant voltage or current signal which does not vary while the temperature is changing. The temperature sensors 120, 220 provide a current or voltage signal based on temperature, but do not provide a reference voltage.

Figure 18:
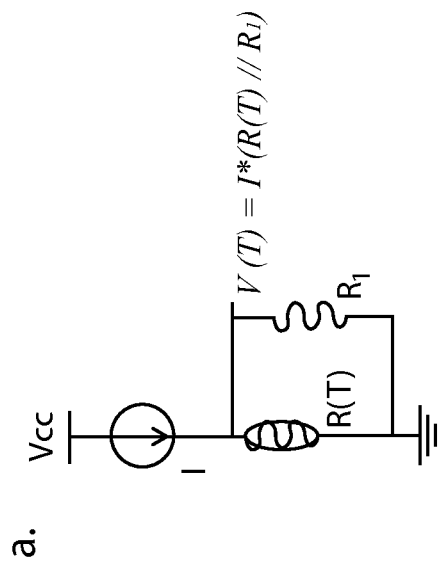
Figure 19:
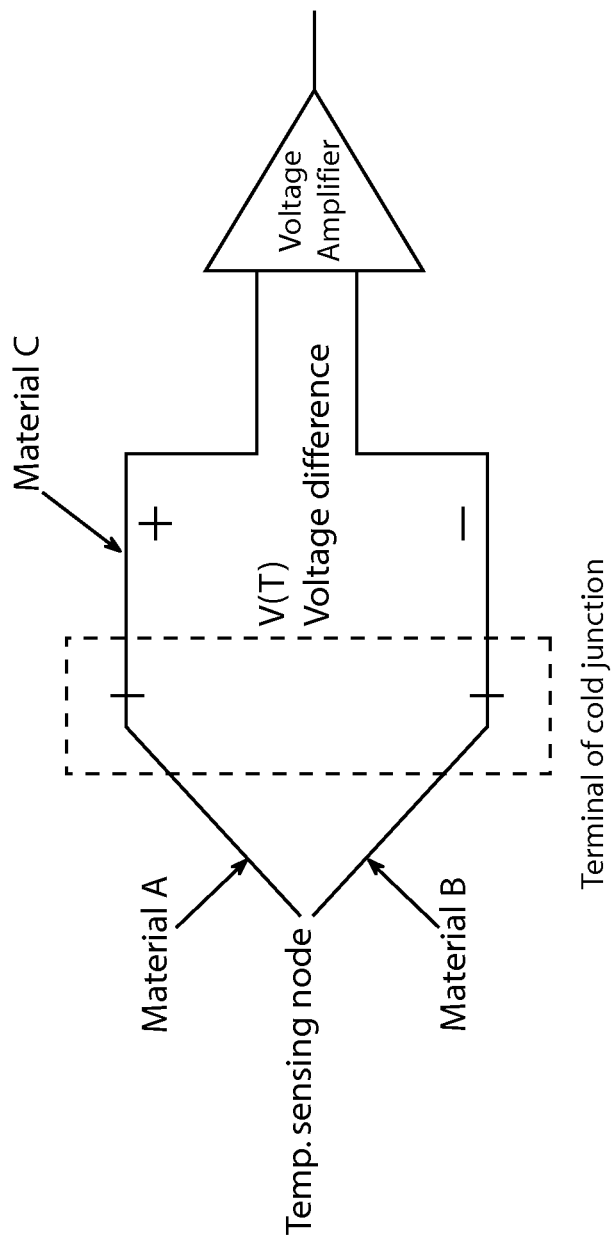
FIG. 19 is a schematic diagram of a thermocouple temperature sensor.

FIGS. 16-18 are exemplary schematic diagrams of possible temperature sensing circuitry 222 configurations that can be used, which is shown in FIG. 10 and discussed above. R(T) shown in FIGS. 16-18 represents the temperature sensing resistance element or resistor. These temperature sensing devices and circuits shown, including determination of the corresponding measured/sensed temperature are well known to those skilled in the art without further elaboration.

Figure 11A:
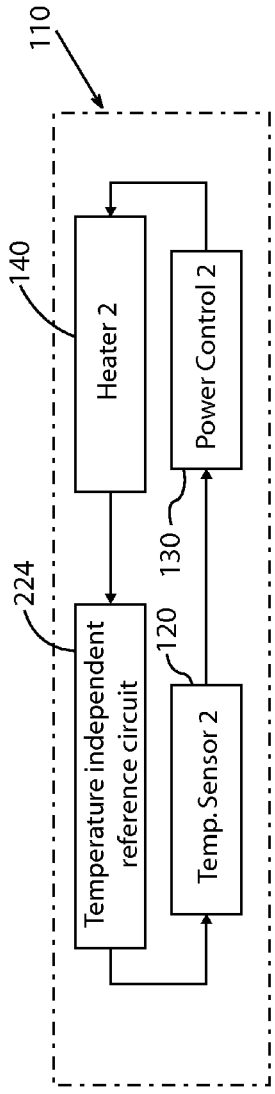
FIG. 11A is a schematic diagram showing a CMOS chip temperature control loop.
Figure 11B:
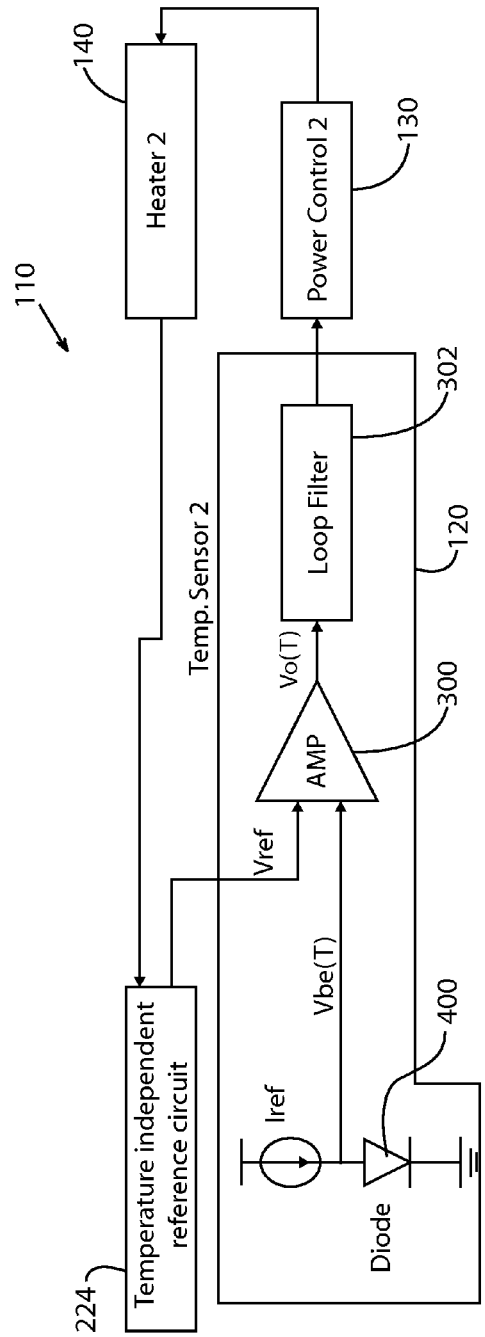
FIG. 11B is a schematic circuit diagram of one embodiment of a temperature sensor useable with the temperature control system disclosed herein.
Figure 11C:
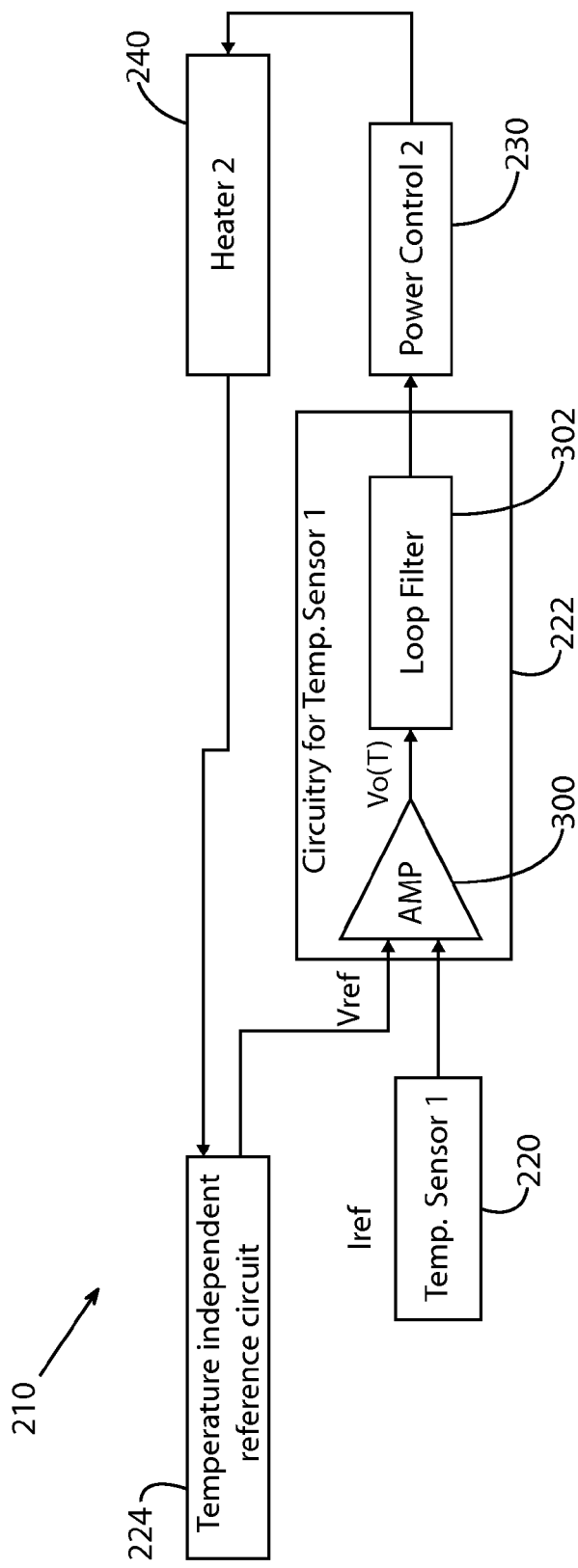
FIG. 11C is a schematic circuit diagram of one embodiment of temperature sensing circuitry for a temperature sensor useable with the temperature control system disclosed herein.

FIGS. 11A and 11B are schematic diagrams showing the CMOS chip temperature control loop 110 and the circuit configuration of temperature sensor 120 in greater detail, respectively. Referring to FIG. 11B specifically, the operation of temperature sensor 120 is to give a constant current "Iref" to drive the diode 400 operation in forward biasing. It results in diode 400 having a forward biasing voltage Vbe(T) which is a temperature dependent signal because diode is a temperature dependent device. This forward biasing voltage Vbe(T) signal is then compared to a temperature independent reference voltage Vref from reference circuit 224 and the difference is amplified by amplifier 300 and loop filter 302 to enhance the SNR (signal to noise ratio).

Figure 12:
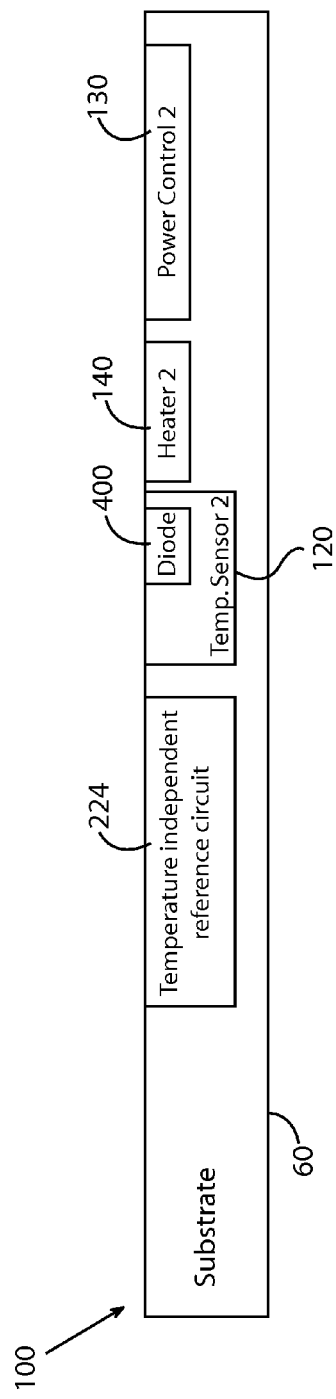
FIG. 12 is a cross-sectional side/elevation view of a CMOS chip showing the physical layout of components in one embodiment of a temperature control loop.
Figure 13:
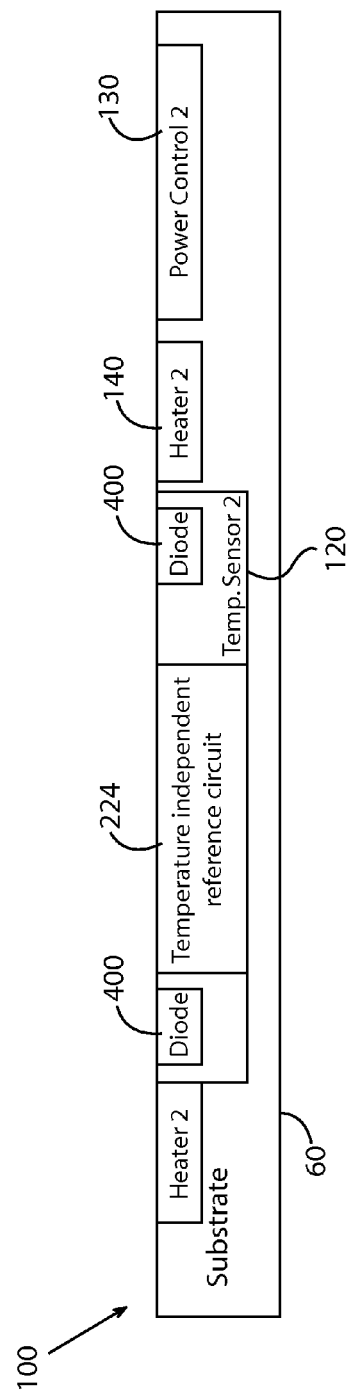
FIG. 13 is a cross-sectional side/elevation view of a CMOS chip showing the physical layout of components in an alternative embodiment of a temperature control loop.

FIG. 12 is a cross-sectional side/elevation view of CMOS chip 100 showing the physical layout of the temperature control loop 110 components of FIG. 11. FIG. 13 is a cross-sectional side/elevation view of an alternative embodiment of CMOS chip 100 showing the physical layout of an alternative arrangement of temperature control loop 110 of FIG. 11 configured as a differential type temperature sensor arrangement. This latter arrangement utilizes two temperature sensing diodes and provides more accurate temperature control of the CMOS chip. Two heaters 140 and diodes 400 are used in FIG. 13 to implement the differential sensing and amplification configuration to enhance the SNR further.

According to one aspect of the present disclosure, an embodiment of a MEMS chip with integrated temperature control system includes a MEMS device having a body, and a heater positioned proximate to and in conductive thermal communication with the MEMS device, the heater including a resistive heating element operable to generate heat when a current flows through the element. The heater is operable to transfer heat directly to the body of the MEMS device by conductive contact between the resistive heating element and the body of the MEMS device.

According to another aspect of the present disclosure, an embodiment of a semiconductor device includes a MEMS chip including a MEMS device having a first heater with resistive heating element and a dedicated first temperature control loop operable to control operation of the first heater, the first heater being disposed proximate to and in conductive thermal communication with the MEMS device, and a CMOS chip including a second heater and a dedicated second temperature control loop operable to control operation of the second heater. The temperature of the MEMS chip and CMOS chip are independently controllable via the first and second temperature control loops, respectively.

According to yet another aspect of the present disclosure, an embodiment of a semiconductor temperature control circuit for heating a MEMS device includes a MEMS temperature control loop including a heater disposed proximate to the MEMS device in a semiconductor package, a power controller controlling operation of the heater, a temperature independent reference circuit, a temperature sensor, and temperature sensing circuitry associated with the first temperature sensor. The first temperature sensing circuitry operably receiving a temperature signal generated by the temperature sensor representing an actual measured operating temperature of the MEMS device and further operably comparing the temperature signal to a reference temperature generated by the temperature independent reference circuit. The temperature sensing circuitry operably generating an output signal to the power controller, the power controller controlling a supply of power to the heater using the output signal generated by the temperature sensing circuitry.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that embodiments according to the present disclosure may be include other forms, structures, arrangements, proportions, sizes, and with other elements, materials, and components, without departing from the spirit or essential characteristics thereof. One skilled in the art will further appreciate that the embodiments may be used with many modifications of structure, arrangement, proportions, sizes, materials, and components and otherwise, used in the practice of the invention, which are particularly adapted to specific environments and operative requirements without departing from the principles of the present invention. In addition, numerous variations in the exemplary methods and processes described herein may be made without departing from the spirit of the present disclosure. The presently disclosed embodiments are therefore to be considered in all respects as illustrative and not restrictive, the scope of the invention being defined by the appended claims and equivalents thereof, and not limited to the foregoing description or embodiments.

What is claimed is:

1. A semiconductor package comprising:
   a substrate;
   a MEMS device provided on the substrate, the MEMS device comprising:
     a body;
     a first heating element integrated with the body, and a dedicated first temperature control loop operable to control operation of the first heating element, the first heating element being operable to generate heat when a current flows through the element and transfer the heat directly to the body of the MEMS device; and
   a CMOS chip provided on the substrate, the CMOS chip including a second heating element and a dedicated second temperature control loop operable to control operation of the second heating element;
   wherein the temperature of the MEMS device and CMOS chip are independently controllable;
   wherein the first temperature control loop comprises a first power controller comprising circuitry operable to control power supply to the first heating element and a first temperature sensor operable to measure an operating temperature of the MEMS device, operation of the first power controller being controlled at least in part by the first temperature sensor;
   wherein the first temperature sensor and first heating element are physically disposed in the MEMS chip; and
   wherein the first power controller is disposed in the CMOS chip.

2. The semiconductor package of claim 1, wherein the first temperature control loop further comprises a temperature independent reference circuit that operably functions in cooperation with the first temperature sensor to compare an actual measured operating temperature of the MEMS device with a setpoint temperature provided by the temperature independent reference circuit.

3. The semiconductor package of claim 1, wherein the second temperature control loop comprises a second power controller comprising circuitry operable to control power supply to the second heater and a second temperature sensor operable to measure an operating temperature of the CMOS chip.

4. The semiconductor package of claim 1, wherein the MEMS device and CMOS chip are disposed in a semiconductor package, the package being sealed and under a vacuum.

5. The semiconductor package of claim 1, wherein the CMOS chip is disposed on the substrate and the MEMS device is stacked above the CMOS chip.

6. The semiconductor package of claim 1, wherein the CMOS chip and MEMS device are disposed side-by-side on a common substrate.

7. The semiconductor package of claim 1, wherein the first heating element comprises a current input terminal and a current output terminal, the terminals being in electrical communication with the heating element.

8. The semiconductor package of claim 1, wherein the first heating element is formed by the body of the MEMS device, the body being made of an electrically conductive metallic or non-metallic containing material having an electrical resistance and being operable to generate heat via current flowing through the body.

9. The semiconductor package of claim 1, wherein the first heating element is a thin film resistive heating element provided onto the body of the MEMS device.

10. The semiconductor package of claim 1, wherein the first heating element is also provided on the substrate adjacent to and in conductive direct contact with the body of the MEMS device by a thermally conductive block.

11. The semiconductor package of claim 1, wherein the first heating element is electrically isolated from the substrate.

12. The semiconductor package of claim 1, wherein the body of the MEMS device is suspended and spaced above the substrate by isolation pedestals.

13. The semiconductor package of claim 12, wherein the isolation pedestals include insulating spacers in contact with the substrate and conductive blocks in contact with the first heating element.

* * * * *